(12) United States Patent
Daoud

(10) Patent No.: US 6,280,236 B1
(45) Date of Patent: Aug. 28, 2001

(54) TESTING SYSTEM WITH BRIDGE CLIP, AND CONNECTOR HAVING A POSITIVE STOP

(75) Inventor: Bassel H. Daoud, Parsippany, NJ (US)

(73) Assignee: Avaya Technology Corp., Basking Ridge, NJ (US)

( * ) Notice: Subject to any disclaimer, the term of this patent is extended or adjusted under 35 U.S.C. 154(b) by 0 days.

(21) Appl. No.: 09/217,090

(22) Filed: Dec. 21, 1998

(51) Int. Cl.⁷ .................................................. H01R 11/18
(52) U.S. Cl. .......................... 439/482; 439/358; 439/948
(58) Field of Search .................................. 439/482, 948, 439/912, 409, 381, 358; 324/72.5

(56) References Cited

U.S. PATENT DOCUMENTS

| | | |
|---|---|---|
| 1,917,683 | 7/1933 | Anderson . |
| 1,926,936 | 9/1933 | Casingena et al. . |
| 2,732,446 * | 1/1956 | Gilmore . |
| 2,895,119 | 7/1959 | Montgomery, Jr. . |
| 2,920,303 | 1/1960 | Johnson . |
| 3,038,141 | 6/1962 | Chiuchiolo . |
| 3,134,632 | 5/1964 | Kimball et al. . |
| 3,546,664 | 12/1970 | De Bolt et al. . |
| 3,571,779 | 3/1971 | Collier . |
| 3,609,647 | 9/1971 | Castellano . |
| 3,699,501 * | 10/1972 | Enright . |
| 3,885,850 | 5/1975 | Witte et al. . |
| 3,918,784 | 11/1975 | Lemke et al. . |
| 3,937,995 | 2/1976 | DeVito . |
| 4,232,924 | 11/1980 | Kline et al. . |
| 4,295,704 * | 10/1981 | Narozny et al. . |
| 4,342,495 | 8/1982 | Bennett . |
| 4,394,620 | 7/1983 | Montalto et al. . |
| 4,398,073 | 8/1983 | Botz et al. . |
| 4,491,381 * | 1/1985 | Hamsher et al. . |
| 4,822,290 | 4/1989 | Cauley et al. . |
| 4,947,115 * | 8/1990 | Siemon et al. ....................... 324/72.5 |
| 4,995,829 * | 2/1991 | Geib ..................................... 439/409 |
| 5,431,578 * | 7/1995 | Wayne ................................. 439/259 |
| 5,454,729 | 10/1995 | Wen-Te . |
| 5,477,161 | 12/1995 | Kardos et al. . |
| 5,614,820 | 3/1997 | Aoyama et al. . |
| 5,641,312 * | 6/1997 | Bippus et al. ....................... 439/922 |
| 6,129,575 | 12/1998 | Daoud . |
| 6,129,577 | 12/1998 | Daoud . |

OTHER PUBLICATIONS

Technical Data Sheet of A.C. Egerton Limited, related to Mini Rocker Cross Connection Cabinets, No Date.

* cited by examiner

Primary Examiner—Neil Abrams
(74) Attorney, Agent, or Firm—Stroock & Stroock & Lavan LLP

(57) ABSTRACT

A connector testing system includes a bridge clip having a body and a test lead connected thereto, a connector having a top portion and a housing having a test channel formed therein, an electrically conductive terminal strip disposed within the connector, and a stop connected to the top portion and positioned to abut the body of the bridge clip to prevent the test lead from being overinserted into the test channel. A connector testing system may include a bridge clip having a body and a test lead with a tip, the test lead being connected to the bridge clip, and a connector including a housing that has a side wall, a front wall, a rear wall, and a bottom wall substantially perpendicular to the side wall, the front wall and the rear wall and extending therebetween. A test channel having an upper section and a lower section is formed by the side wall, the front wall, the rear wall and the bottom wall. A portion of a terminal strip is disposed within the test channel. A tapered guiding shoulder is formed with the side wall for guiding the test lead tip as it moves from the upper section of the test channel to the lower section of the test channel and into engagement with the terminal strip.

19 Claims, 4 Drawing Sheets

TESTING SYSTEM WITH BRIDGE CLIP, AND CONNECTOR HAVING A POSITIVE STOP

FIELD OF THE INVENTION

This invention relates to the field of telephone wire connector blocks and distribution systems, and specifically to a connector and a test device for testing wiring connected to the connector.

BACKGROUND OF INVENTION

In a telephone network, a network cable from the central office is generally connected to a junction box, such as, for example, a building entrance protector (BEP) or network interface unit (NIU) located at the customer site, where the individual telephone lines are broken out line-by-line. The network cable, which consist of a plurality of tip-ring wire pairs that each represent a telephone line, is typically connected to a connector block containing an array of individual connectors that forms a part of the BEP. Such connectors may be, for example, mini rocker tool-less insulation displacement (IDC)-type connectors, such as, for example, those sold by A.C. Egerton, Ltd. Other connectors used for telephony wiring applications are described in U.S. Pat. No. 4,662,699 to Vachhani et al., dated May 5, 1987, and in U.S. Pat. No. 3,611,264 to Ellis, dated Oct. 5, 1971.

The customer telephone equipment is coupled through such an IDC connector to, for example, a central office telephone line. The connector generally has a top section that includes two wire insertion holes and a housing within which a pair of spaced-apart terminal strips are disposed. The wire insertion holes each accommodate one wire of a tip-ring wire pair. The top section pivots about a generally hinged fixed axis located on the side opposite the wire insertion holes and has a movable clasp for maintaining the top section in its closed position.

To open the top section, a user releases the clasp member and pivots the top section to its open position. When the top section is in its open position, the terminal strips do not intersect the wire insertion holes, but when the top section is in its closed position, the terminal strips intersect the wire insertion holes. Therefore, to establish an electrical and mechanical connection between the wires and the terminal strips, a user first opens the top section (i.e., pivots the top section to its open position), inserts the pair of wires, and then closes the top section. Upon closing the top section of the connector, the wires are brought into electrical and mechanical contact with the terminal strips. To remove the wires and/or break the electrical connection, the process is reversed.

To verify the integrity of a telephone line, the telephone line may be tested at the connector using a bridge clip, test probe or other common test gear. The bridge clip includes a body, at least a first test prong and a second test prong connected to the body, and lead wires for connecting the first and second test prongs to a testing device, such as a voltmeter or telephone test set. Two test channels sized to accommodate a test prong of a bridge clip are formed in the housing of the connector and a portion of a respective one of the pair of terminal strips is disposed in each of the test channels. The test prongs or test leads are spaced apart and constructed to be received within the channels.

Testing is typically performed by inserting the test prongs of a bridge clip into the test channels of the connector until each of the test prongs contacts an outside edge of a respective one of the pair of terminal strips housed within the housing to make an electrical connection. If a current flow is detected, or a dial tone is heard, depending on the test methodology, then a loop condition exists for that particular tip-ring wire pair, and the integrity of the line is verified. If no loop condition is found, either an electrical open or short exists in telephone line or a connection to or in the terminal block is defective.

Prior art test prongs typically consist of flexible metallic strips that are bent inwardly at one location so as to bias the free end of the test prong against the terminal strip. One example of such a bridge clip is A.C. Egerton part no. RBC2210. After repeated use, however, one or both of the test prongs can bend outwardly at the point where the test prong is connected to the test body or where the angle of test prong is bent. In either case, the test prong no longer retains its original shape. In this case, the connection made with the prior art test prong is not reliable because the entire depth of the test channel is sized to accept the test prong at its widest point. Therefore, when the craftsperson inserts the test probes of the bridge clip into the test channels to perform the test with the testing device, the test prongs can move within the test channels. And, because any movement of the bridge clip can cause the testing prongs to break the electrical connection with the terminal strips, thereby causing a false test reading, the craftsperson must affirmatively hold the bridge clip to the connector to ensure a secure electrical connection.

Further, the prior art connector testing systems do not prevent the user from inadvertently overinserting the test prongs to a position where the prongs cause damage to the connector. When correctly inserted into the test channels of the prior art connector, the prior art bridge clip body is spaced apart from the top portion of the connector. Therefore, the prior art mini-rocker connector testing systems provide no indicator or signal to the craftsperson when the test prongs of the bridge clip are properly positioned within test channels of the connector.

SUMMARY OF THE INVENTION

The present invention is directed at overcoming shortcomings in the prior art. A connector testing system in accordance with the present invention preferably includes a bridge clip having a body and a test lead connected thereto, a connector having a top portion and a housing, and an electrically conductive terminal strip disposed within the connector. The housing has a test channel formed therein. The top portion includes a stop positioned to prevent the test lead from being overinserted into the test channel. In this manner, when testing the connector, the craftsperson inserts the bridge clip test lead until the bridge clip abuts the stop of the connector. At this point, the craftsperson stops inserting the test lead into the test channel thereby protecting the interior connector components from damage due to overinsertion. The stop is preferably sized to prevent further insertion of the bridge clip test lead when the test lead is properly positioned within the test channel and makes an electrical connection.

Further, in accordance with another embodiment of the invention, the connector housing includes a side wall having an upper portion, a middle portion and a lower portion. The side wall forms one side of the test channel, which has an upper section adjacent the upper portion of the side wall, a middle section adjacent the middle portion of the side wall, and a lower section adjacent the lower portion of the side wall. The middle and lower portion of the side wall are formed by an angled shoulder, which is preferably formed with the side wall. The shoulder guides the test probe from the upper section of the test channel to the lower section of the test channel. The width of the lower section of the test channel is sized to accept the test lead tip so that when the test lead tip is in the lower channel, the test lead is stabilized within the test channel. As such, the test lead is less likely to wobble in the test channel and cause intermittent contact between the test lead and the terminal strip.

In this way, the testing system provides a reliable way of preventing overinsertion of the test lead and provides a test lead stabilizer that assists the test lead in making continuous electrical contact with the terminal strip of the connector during testing procedures.

Other objects and features of the present invention will become apparent from the following detailed description, considered in conjunction with the accompanying drawing figures. It is to be understood, however, that the drawings, which are not to scale, are designed solely for the purpose of illustration and not as a definition of the limits of the invention, for which reference should be made to the appended claims.

BRIEF DESCRIPTION OF THE DRAWINGS

In the drawing figures, which are not to scale, and which are merely illustrative, and wherein like reference numerals depict like elements throughout the several views.

DETAILED DESCRIPTION OF THE PREFERRED EMBODIMENTS

Generally speaking, in accordance the present invention, a connector testing system is provided that provides a more reliable testing configuration.

Figure 1:
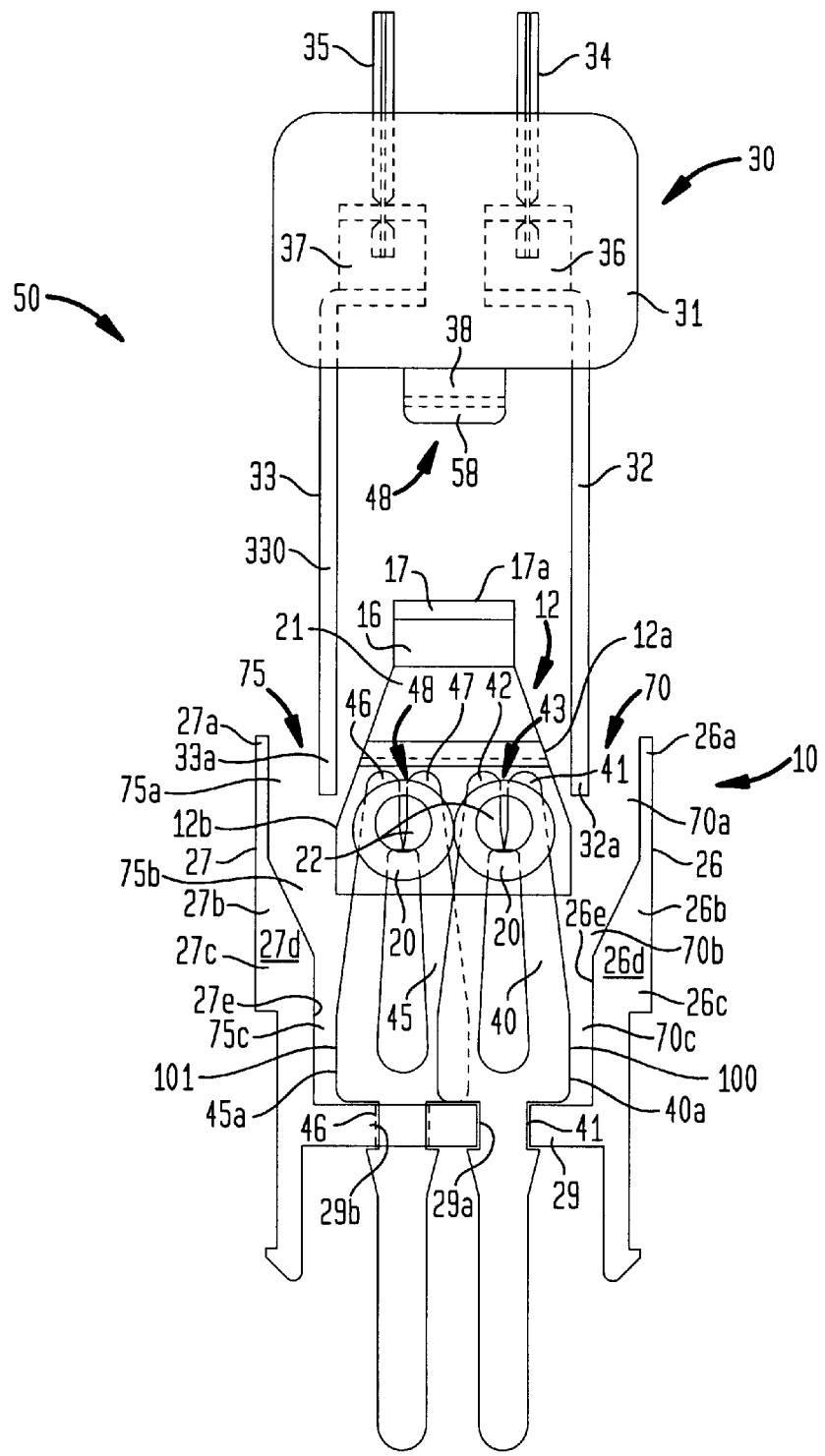
FIG. 1 is a front sectional view of a connector testing system constructed in accordance with the present invention.
Figure 2:
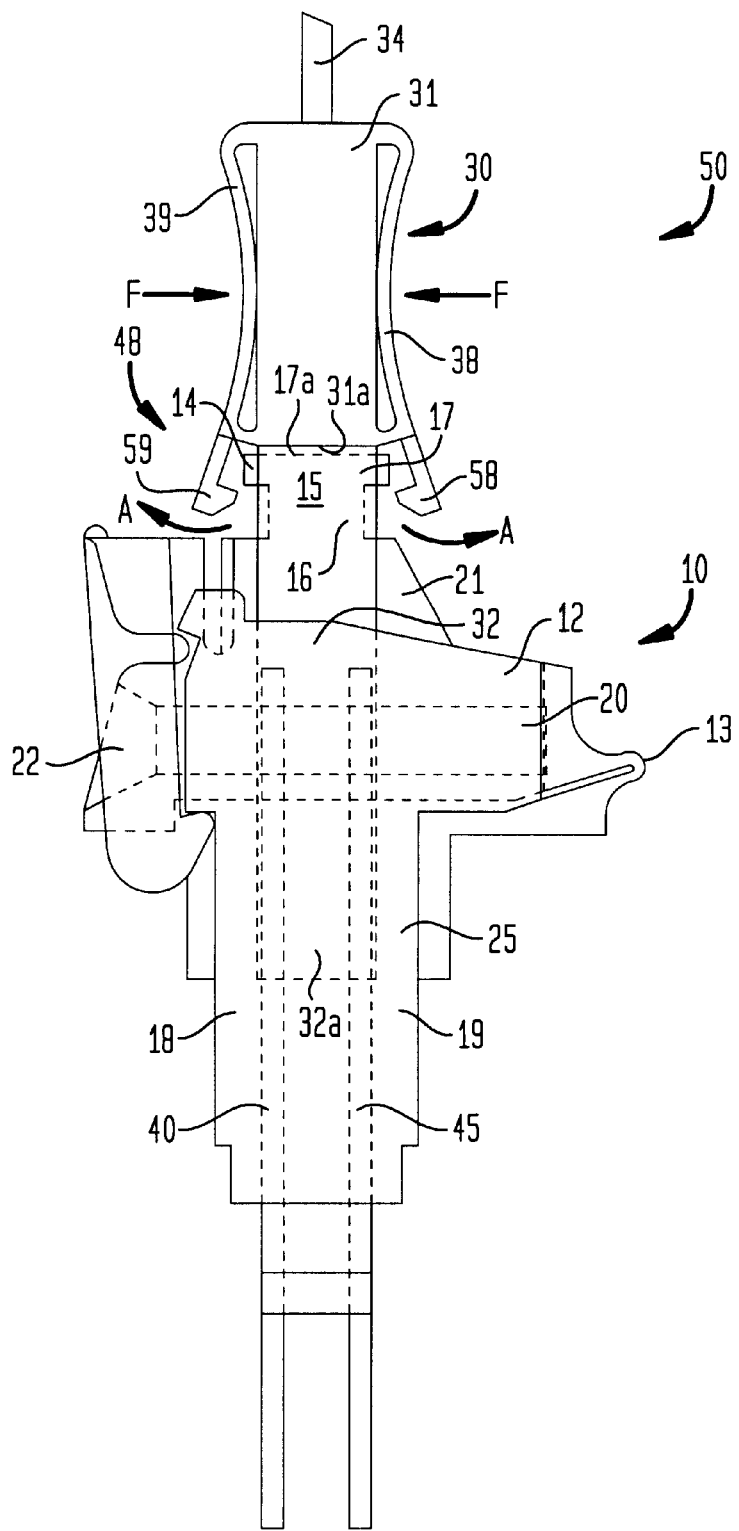
FIG. 2 is a side elevational view of the connector testing system of FIG. 1.

Referring initially to FIGS. 1 and 2, a connector testing system 50 includes a connector 10 having a bridge clip 30, a housing 25, a top portion 12, and a first terminal strip 40 and a second terminal strip 45 disposed within housing 25 and top portion 12 when top portion 12 is in the closed position as is shown in each of the figures. Terminal strip 40 includes an inner arm 41 and an outer arm 42, which together form an electrical conductor gripping region 43. Outer arm 42 includes a contact surface 40a, which extends from the tip of outer arm 42 to the region of outer arm 42 adjacent bottom wall 29. Similarly, terminal strip 45 includes an inner arm 46 and an outer arm 47, which together form an electrical conductor gripping region 48. Outer arm 47 includes a contact surface 45a, which extends from the tip of outer arm 47 to the region of outer arm 47 adjacent bottom wall 29. As is shown in FIG. 2, top portion 12 is pivotably mounted to housing 25 about a hinge 13. Connector 10 has two entrance apertures 22 that lead to wire insertion holes 20. Wire insertion holes 20 are constructed to accept electrical conductors (not shown) in a manner known in the art. When top portion 12 is in its closed position as shown in the figures, electrical conductors (not shown) are gripped within gripping regions 43, 48.

Housing 25 includes a first side wall 26, a second side wall 27, a front wall 18 and a rear wall 19, extending between side walls 26, 27, and a bottom wall 29, positioned substantially perpendicular to side walls 26, 27, front wall 18 and rear wall 19 and extending therebetween. Bottom wall 29 has throughholes 29a, 29b sized to accept snap fit recesses 41, 46 of terminal strips 40, 45, which are secured through the mating engagement of throughholes 29a, 29b and snap fit recesses 41, 46. The specific means of affixing terminal strip 40 within connector housing 25 need not be solely by snap-fitting as described above, but by any one of the numerous methods of affixation known in the art, such as by way of non-limiting example, adhesives, friction fitting, integral molding, screws, and the like, depending on whether ready removal and re-insertion of the terminal is required, as a matter of application-specific design choice.

As is shown in FIG. 1, to facilitate testing of connections made through connector 10, a first test channel 70 and a second test channel 75 are formed between housing 25 and top section 12 to permit bridge clip test leads to be inserted so as to contact terminal strips 40, 45.

Top portion 12 includes a plinth 21, a base 16, which extends upwardly from plinth 21, and a stop 17, which extends from the top of base 16, and includes an upper surface 17a. In one embodiment, stop 17 can take the form of a flange that extends outwardly from base 16. In such an embodiment, stop 17 includes a lip 14, and base 16 and stop 17 form a cap 15 having a substantially t-shaped profile when seen from the side elevational view of FIG. 2. As is described below, stop 17 acts to prevent the test lead of bridge clip 30 from being overinserted into the test channel. Top portion 12 includes sloping regions 12a and 12b, which extend downwardly from upper surface 17a. As is described below, sloping regions 12a, 12b act to guide tips 32a, 33a of test probes 32, 33 to test channels 70, 75.

Connector 10 is preferably formed of a molded synthetic resinous material with good insulating properties and mechanical strength. The specific material utilized in constructing connector 10 are an application-specific matter of design choice within the knowledge of the person of skill familiar with terminal blocks utilized in the telephony art. In all embodiments, terminal strip 40, as well as test leads 32, 33, may be formed of any commonly known electrically conductive metal or electrical conductor known in the art and suitable for use in such terminals, such as, for example, platinum-washed phosphor bronze, or beryllium-copper alloy or any other material, metal or alloy combining good electrical conductivity with sufficient mechanical strength and resilience.

Referring to FIGS. 1 and 2, bridge clip 30 is depicted in greater detail. Bridge clip 30 includes a body 31, having a lower surface 31a, and test leads 32, 33 and electrical conductors 34, 35. Test lead 32 and conductor 34 are connected to body 31 at connection region 36, and test lead 33 and conductor 35 are connected to body 31 at connection region 37. Test lead 32 has a tip 32a and forms an electrical connection through connection region 36 and electrical conductor 34 to a testing device (not shown). Likewise, test lead 33 has a tip 33a and forms an electrical connection through connection region 37 and electrical conductor 35 to the testing device. Test leads 32, 33 are preferably straight, flat electrically conductive blades, but may be any shape, including, by way of non-limiting example, tapered cylinders, so long as the test channels and test leads can be shaped to matingly engage.

Referring to FIG. 2, bridge clip 30 also includes a latch 48 having a first beam 38 formed with a first hook 58, and a second beam 39 formed with a second hook 59. Preferably, beams 38, 39 and hooks 58, 59 are integrally formed with body 31, however, hooks 58, 59 may be connected to beams 38, 39 in any fashion known to those skilled in the art. First hook 58 and second hook 59 are constructed to matingly engage with stop 17 when test leads 32, 33 of bridge clip 30 are inserted into test channels 70, 75.

Figure 4:
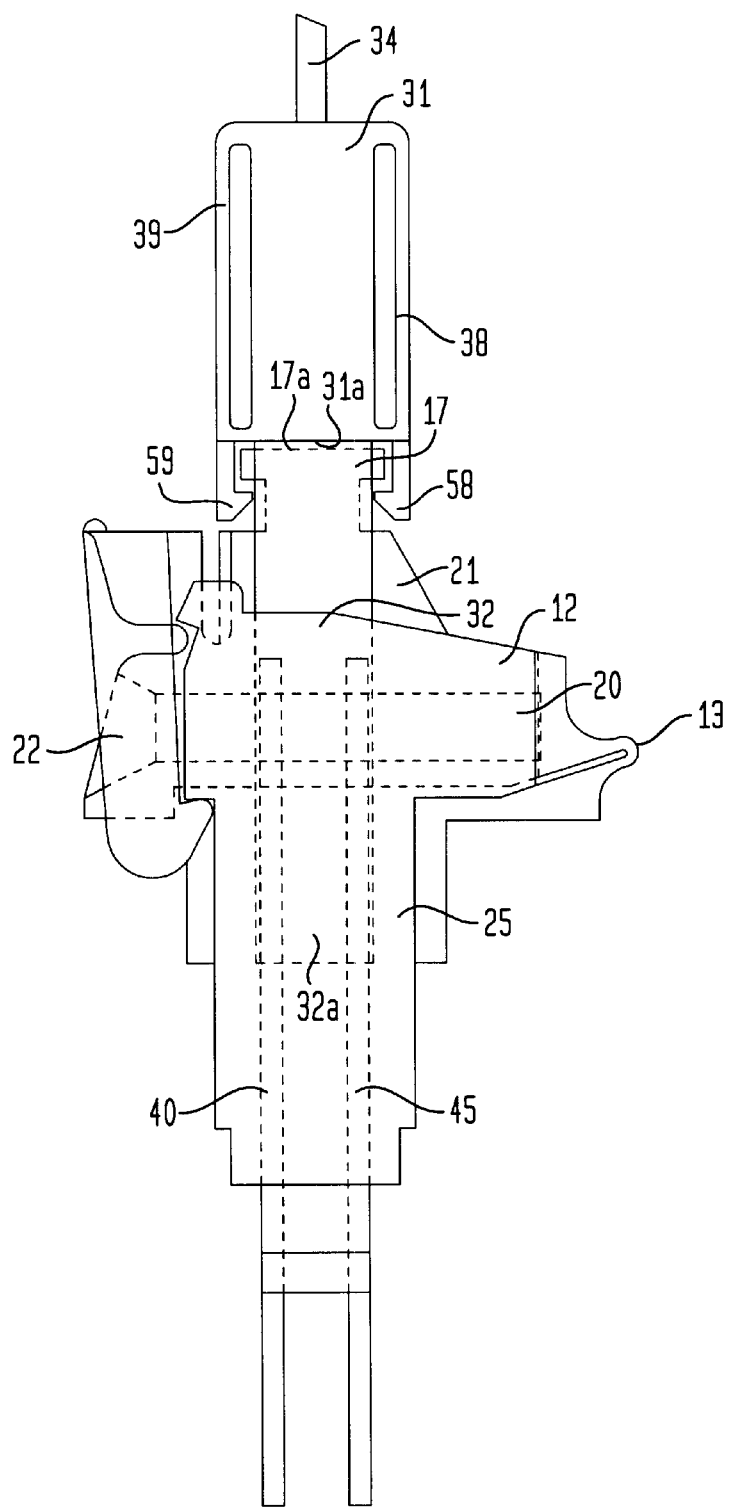
FIG. 4 is a side elevational view of the connector testing system of FIG. 1 at the engaged position.

Latch 48 is preferably spring-loaded. That is, as is shown in FIG. 2, beams 38 and 39 are elastically deformable and thus act as a release mechanism when a force shown as arrows F is applied to beams 38, 39 thereby deflecting beams 38, 39 inwardly and rotating hooks 58, 59 outwardly from stop 17 in a direction shown by arrows A to disengage from lip 14. Thus, latch 48 is in its open position as shown in FIG. 2, when beams 38 are deflected inwardly by a force F. Conversely, as best shown in FIG. 4, latch 48 is in its closed position when test leads 32, 33 are inserted into test channels 70, 75 and first hook 58 and second hook 59 engage lip 14 of stop 17.

Referring to FIG. 1, side wall 26 includes an upper portion 26a, a middle portion 26b and a lower portion 26c having an inner surface 26e. Test channel 70 is defined by side wall 26, bottom wall 29, front wall 18, rear wall 19, and terminal strip 40. Test channel 70 includes an upper section 70a positioned adjacent upper portion 26a, a middle section 70b positioned adjacent middle section 26b, and a lower section 70c positioned adjacent lower portion 26c. The middle and lower portions 26b, 26c of side wall 26 are formed by an angled shoulder 26d, which is preferably formed with side wall 26. Lower section 70c of test channel 70 is sized to accept test lead tip 32a so that when test lead tip 32a is disposed within lower section 70c, test lead 32 is stabilized and guided against terminal strip 40 within test channel 70. Middle section 70b of test channel 70 acts as a guiding transition from the relatively wide upper section 70a to the relatively narrow lower section 70c.

Referring to FIG. 1, side wall 27 is formed similarly to side wall 26, and has an upper portion 27a, a middle portion 27b and a lower portion 27c having an inner surface 27e. Test channel 75 is formed by side wall 27, bottom wall 29, front wall 18, rear wall 19, and terminal strip 45. Test channel 75 includes an upper section 75a positioned adjacent upper portion 27a, a middle section 75b positioned adjacent middle section 27b, and a lower section 75c positioned adjacent lower portion 27c. The middle and lower portions 27b, 27c of side wall 27 are formed by an angled shoulder 27d, which is preferably formed with side wall 27. Lower section 75c of test channel 70 is sized to accept test lead tip 33a so that when test lead tip 33a is disposed within lower section 75c, test lead 33 is stabilized and guided against terminal strip 45 within test channel 75. Middle section 75b of test channel 75 acts as a guiding transition from the relatively wide upper section 75a to the relatively narrow lower section 75c.

Referring to FIG. 1, testing system 50 of the current invention is shown in a first position, wherein test leads 32, 33 of bridge clip 30 are depicted just prior to being inserted into test channels 70, 75, respectively. To position test lead tips 32a, 33a so that they contact terminal strips 40, 45, respectively, at test points 100, 101 on the terminals, the craftsperson inserts test leads 32, 33 into test channels 70, 75.

Figure 3:
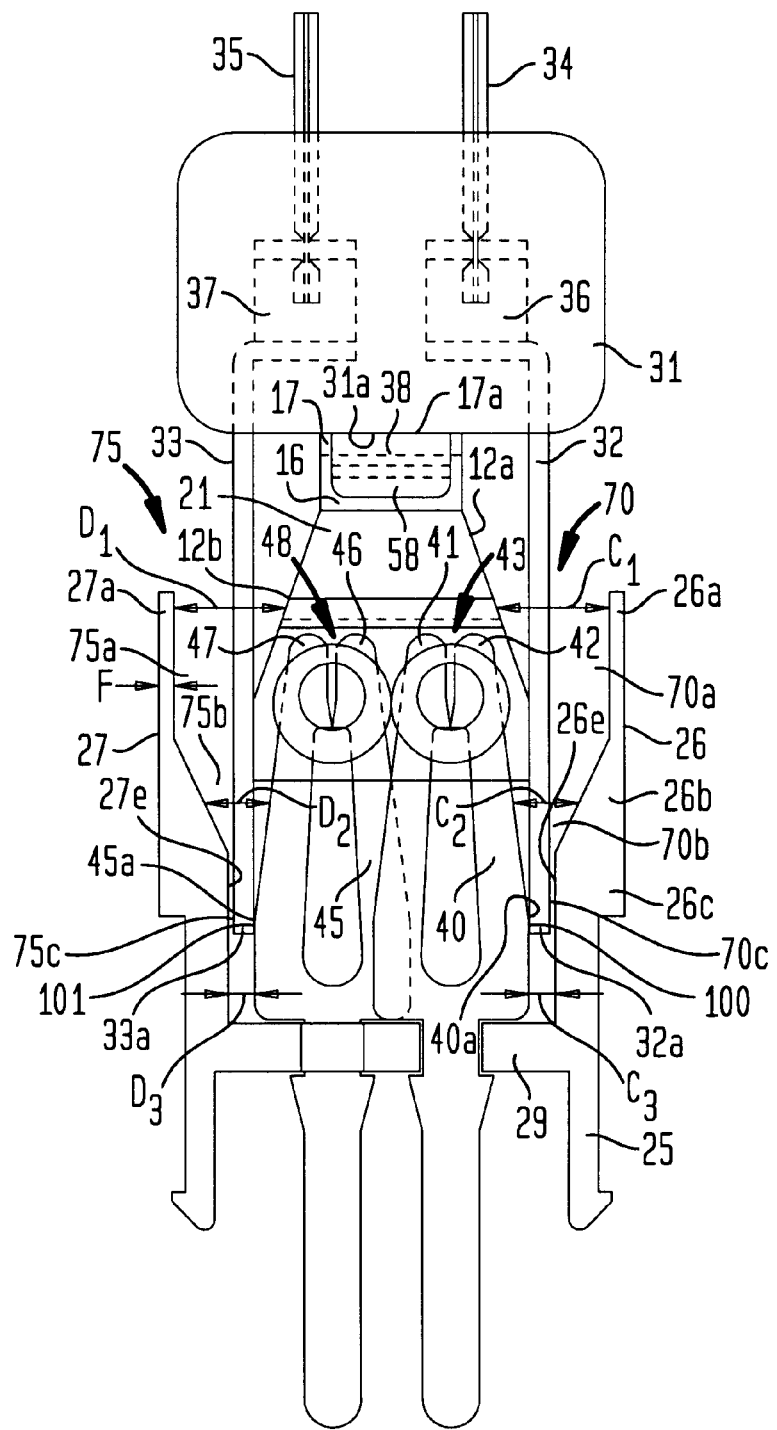
FIG. 3 is a front sectional view of the connector testing system of FIG. 1 at an engaged position.

In one embodiment, shown in FIG. 2, the craftsperson compresses beams 38 and 39 of bridge clip 30 in the direction shown as arrows F to rotate hooks 58 and 59 outward in the direction shown by arrows A. Once hooks 58 and 59 rotate a distance sufficient to clear catch lip 14 of stop 17, the craftsperson continues to insert test leads 32, 33 until lower surface 31a of body 31 of bridge clip 30 contacts upper surface 17a of stop 17. At this time, as shown in FIGS. 3 and 4, the craftsperson can stop compressing beams 38 and 39, which permits hooks 58 and 59 to rotate to the closed position and engage lip 14 of stop 17. In the fully inserted position, test leads tips 32a, 33a are disposed within lower portion 70c, 75c of test channels 70, 75.

Referring to FIG. 3, the features of test channels 70, 75 will now be described. Preferably, test channel 70 is at its widest at the mouth 70a of test channel 70, where test lead 32 is initially inserted into connector 10. At this location, the width, represented by $C_1$, is measured from the inner surface of upper portion 26a of side wall 26 to sloping region 12a, and wide enough to easily accommodate test lead tip 32a. In this way, the craftsperson can readily locate mouth 70a of test channel 70 when first inserting test probe 32 of the testing device. Test channel width $C_1$ decreases to width $C_2$ at a middle section 70b of test channel 70, where $C_2$ is measured from the inner surface of angled shoulder 26d to contact surface 40a of terminal strip 40. In middle section 70b, tip 32a is guided to a position proximate contact surface 40a of terminal strip 40. Test channel width $C_2$ decreases to width $C_3$ at a lower section 70c of test channel 70, where $C_3$ is measured from inner surface 26c of lower portion 26c of side wall 26 to contact surface 40a of terminal strip 40. Width $C_3$ is dimensioned to accept tip 32a. As such, when test lead tip 32a is disposed within lower section 70c, test lead 32 is stabilized and guided into maintaining contact with contact surface 40a. As such, lead 32 is less likely to wobble in test channel 70 and make intermittent contact with terminal strip 40. Of course, side wall 26 may contain more than three portions, and in one embodiment the width of upper portion 26a may gradually increase from the top of side wall 26 until it forms lower section 70c of test channel 70 with contact surface 40a.

Similarly, test channel 75 is preferably at its widest at the mouth 75a of test channel 75, where test lead 33 is initially inserted into connector 10. At this location, the width, represented by $D_1$, is measured from the inner surface of upper portion 27a of side wall 27 to sloping region 12b, and wide enough to easily accommodate test lead tip 33a. In this way, the craftsperson can readily locate mouth 75a of test channel 75 when first inserting test probe 33 of the testing device. Test channel width $D_1$ decreases to width $D_2$ at a middle section 75b of test channel 75, where $D_2$ is measured from inner surface of angled shoulder 27d to contact surface 45a of terminal strip 45. In middle section 75b, tip 33a is guided to a position proximate contact surface 45a of terminal strip 45. Test channel width $D_2$ decreases to width $D_3$ at a lower section 75c of test channel 75, where $D_3$ is measured from inner surface 27e of lower portion 27c of side wall 27 to contact surface 45a of terminal strip 45. Width $D_3$ is a distance sufficient to accept tip 33a. As such, when test lead tip 33a is disposed within lower section 75c, test lead 33 is stabilized and guided into maintaining contact with contact surface 45a. As such, lead 33 is less likely to wobble in test channel 75 and make intermittent contact with terminal strip 45. Of course, side wall 27 may contain more than three portions, and in one embodiment the width of upper portion 27a may gradually increase from the top of side wall 27 until it forms lower section 75c of test channel 75 with contact surface 45a.

In this manner, when testing connector 10, the craftsperson inserts test leads 32, 33 until lower surface 31a of body 31 of bridge clip 30 abuts upper surface 17a of stop 17 of connector 10. At this point, the craftsperson stops inserting test leads 32, 33 into test channels 70, 75, and thereby protects the interior connector components from damage due to overinsertion. Stop 17 is preferably sized to prevent further insertion of test leads 32, 33 when test lead tips 32a, 33a are properly positioned within lower sections 70c, 75c of test channels 70, 75. At this position a portion of tips 32a, 33a makes an electrical connection with contact surfaces 40a, 45a at test points 100, 101, of terminal strips 40, 45.

While the preferred embodiment includes a bridge clip having a latch 48, it is understood that such a feature is not necessary to implement the inventive features. Connector 10 need only include stop 17 that functions to limit the insertion of test leads 32, 33 of bridge clip 30. While stop 17 is preferably connected to or formed with top portion 12, stop 17 may include two stop portions, one of which is positioned within lower section 70c of test channel 70, and the other of which is positioned within lower section 75c of test channel 75, by way of non-limiting example. The stop portions could also be formed with side walls 26c, 27c or with the partition walls (not shown) that separate terminal strip 40 from terminal strip 45.

As such, the current testing configuration provides a more reliable electrical connection. Further, the connector of the present invention may be used in a wiring enclosure, such as, for example, a building entrance protector (BEP) or a network interface unit (NIU).

Thus, while there have been shown and described and pointed out fundamental novel features of the invention as applied to preferred embodiments thereof, it will be understood that various omissions and substitutions and changes in the form and details of the disclosed invention may be made by those skilled in the art without departing from the spirit of the invention. It is the intention, therefore, to be limited only as indicated by the scope of the claims appended hereto.

What is claimed is:

1. A connector testing system, comprising:
    a bridge clip having a body and a test lead connected thereto;
    a connector having a top portion and a bottom portion comprising a housing having a tapered test channel formed therein;
    said top portion being movable between an open position and a closed position, said top portion having therein at least one wire insertion hole, having a longitudinal axis, for guidedly receiving a wire, said wire insertion hole having an entrance aperture for entry of said wire, said open position facilitating entry of said wire in said wire insertion hole;
    an electrically conductive terminal strip disposed within the connector, for mechanical and electrical mating with said wire when said top portion is in said closed position; and
    a stop connected to the top portion and positioned to abut the body of the bridge clip to prevent the test lead from being overinserted into the test channel;
    said housing including a side wall, a front wall, a rear wall, and a bottom wall substantially perpendicular to the side wall, the front wall and the rear wall and extending therebetween, the test channel being defined by a portion of each of the side wall, the front wall, the rear wall and the bottom wall, said longitudinal axis of said at least one wire insertion hole being independent of said test channel and oriented substantially parallel to said first and said second side walls and substantially perpendicular to said front and said rear walls.

2. The connector testing system of claim 1, wherein the stop is formed with the top portion.

3. The connector testing system of claim 1, wherein the stop is preferably sized to prevent further insertion of the test lead when the test lead is properly positioned within the test channel and makes an electrical connection with the terminal strip.

4. The connector testing system of claim 1, wherein the test channel has a test point.

5. The connector testing system of claim 4, wherein the test point is a portion of the terminal strip.

6. A connector testing system, comprising:
    a bridge clip having a body and a test lead connected thereto, the test lead having a tip;
    a connector having a top portion and a bottom portion comprising a housing having a test channel formed therein;
    said top portion being movable between an open position and a closed position, said top portion having therein at least one wire insertion hole for guidedly receiving a wire, said wire insertion hole having an entrance aperture for entry of said wire, said open position facilitating entry of said wire in said wire insertion hole;
    said connector including a housing having a side wall, a front wall, a rear wall, and a bottom wall substantially perpendicular to the side wall, the front wall and the rear wall and extending therebetween, and a test channel having an upper section and a lower section defined by a portion of each of the side wall, the front wall, the rear wall and the bottom wall;
    said at least one wire insertion holes being oriented substantially parallel to said first and said second side walls and substantially perpendicular to said front and said rear walls;
    an electrically conductive terminal strip disposed within the connector, for mechanical and electrical mating with said wire when said top portion is in said closed position; the terminal strip having a portion disposed within the test channel; and
    a guiding shoulder formed on a portion of the side wall for guiding the test lead tip in the test channel into contact with the terminal strip portion as it moves from the upper section of the test channel to the lower section of the test channel.

7. The connector testing system of claim 6, wherein the test channel includes an upper section and a lower section, and a first distance measured between the side wall and the terminal strip at the upper section is greater than a second distance measured between the side wall and the terminal strip at the lower section.

8. The connector testing system of claim 7, wherein the second distance is sized to closely contain the tip of the test lead so as to stabilize the test lead when the test lead is inserted into the lower section of the test channel.

9. The connector testing system of claim 6, wherein the terminal strip includes a contact surface, the test channel includes an upper section and a lower section, and a first distance measured between the side wall and a plane coincident with the contact surface at the upper section is greater than a second distance measured between the side wall and the plane coincident with the contact surface at the lower section.

10. A connector testing system, comprising:
    a bridge clip having a body, and a first test lead connected to the body and a second test lead spaced apart from the first test lead and connected to the body, the first test lead having a first tip and the second test lead having a second tip;

a connector having a top portion and a bottom portion comprising a housing having a test channel formed therein;

said top portion being movable between an open position and a closed position, said top portion having therein first and second wire insertion holes for guidedly receiving a first and second wire, said first wire insertion hole having a first entrance aperture for entry of said first wire, said second wire insertion hole having a second entrance aperture for entry of said second wire, said open position facilitating entry of said first and second wires in said first and second wire insertion holes;

said connector including a housing having a first side wall, a second side wall, a front wall, a rear wall, and a bottom wall substantially perpendicular to the first and second side walls, the front wall and the rear wall and extending therebetween, a first test channel having an upper section and a lower section defined by a portion of each of the first side wall, the front wall, the rear wall and the bottom wall, and a second test channel having an upper section and a lower section defined by a portion of each of the second side wall, the front wall, the rear wall and the bottom wall;

said first and second wire insertion holes being oriented substantially parallel to said first and second side walls and substantially perpendicular to said front and rear walls;

a first terminal strip disposed within the connector, for mechanical and electrical mating with said wire when said top portion is in said closed position, the first terminal strip having a portion disposed within the first test channel;

a second terminal strip disposed within the connector and spaced apart from the first terminal strip, for mechanical and electrical mating with said wire when said top portion is in said closed position, the second terminal strip having a portion disposed within the second test channel;

a first shoulder connected to the first side wall for guiding the first tip as it moves from the upper section of the first test channel to the lower section of the first test channel; and a second shoulder connected to the second side wall for guiding the second tip as it moves from the upper section of the second test channel to the lower section of the second test channel.

11. A method of testing an electrical connection, comprising the steps of:

inserting a tip of a test lead of a testing device into a test channel of a connector, said connector having a top portion and a bottom portion comprising a housing having a test channel formed therein;

said top portion being movable between an open position and a closed position, said top portion having therein at least one wire insertion hole for guidedly receiving a wire, said wire insertion hole having an entrance aperture for entry of said wire, said open position facilitating entry of said wire in said wire insertion hole;

said connector having a first terminal strip disposed within the connector, for mechanical and electrical mating with said wire when said top portion is in said closed position; the first terminal strip having a portion disposed within the first test channel;

the test channel having an upper section and a lower section; and guiding the tip of the test lead with a shoulder formed with a side wall of a housing of a connector to the lower section of the test channel.

12. The method of testing an electrical connection of claim 11, wherein the test lead is further inserted into the test channel until the tip is seated within the lower section of the test channel until a portion of the tip contacts the terminal strip.

13. The method of testing an electrical connection of claim 11, wherein the test lead is inserted until the testing device abuts a stop of the connector to prevent the test lead from being further inserted.

14. A connector comprising:

a top portion and a bottom portion comprising a housing having a test channel formed therein;

said top portion being movable between an open position and a closed position, said top portion having therein at least one wire insertion hole for guidedly receiving a wire, said wire insertion hole being oriented substantially parallel to a first side wall and a second side walls and substantially perpendicular to a front wall and a rear wall and having an entrance aperture for entry of said wire, said open position facilitating entry of said wire in said wire insertion hole;

a top surface;

a terminal strip, for mechanical and electrical mating with said wire when said top portion is in said closed position, mounted below said top surface; and a test channel having therewithin a portion of said terminal strip, said channel being so shaped and sized as to guidedly urge a test lead of a test device into contact with said terminal strip portion as said lead is inserted in said channel.

15. The connector of claim 14, further comprising a stop feature formed on said top surface, said stop feature being so sized and shaped as to prevent overinsertion of said test lead in said test channel.

16. The connector of claim 15, wherein said connector is one of an array of connectors mounted on a connector block.

17. The connector of claim 16, wherein said connector block is mounted in a wiring junction box.

18. The connector of claim 17, wherein said junction box is a building entrance protector.

19. The connector of claim 17, wherein said junction box is a network interface unit.

* * * * *